United States Patent [19]
Ohkubo et al.

[11] Patent Number: 5,962,873
[45] Date of Patent: Oct. 5, 1999

[54] SEMICONDUCTOR LASER DEVICE HAVING A COD-PREVENTING STRUCTURE

[75] Inventors: Michio Ohkubo, Fujisawa; Tetsuro Ijichi, Chigasaki; Yoshikazu Ikegami, Yokohama, all of Japan

[73] Assignee: The Furukawa Electric Co., Ltd., Tokyo, Japan

[21] Appl. No.: 08/943,054

[22] Filed: Oct. 2, 1997

[30] Foreign Application Priority Data

Oct. 7, 1996 [JP] Japan .................................. 8-265852

[51] Int. Cl.⁶ ................................................. H01L 33/00
[52] U.S. Cl. .......................... 257/94; 257/103; 257/751; 372/45; 372/48; 372/49
[58] Field of Search .............................. 257/94, 98, 103, 257/750, 751; 372/45, 48, 49

[56] References Cited

U.S. PATENT DOCUMENTS 5,228,047   7/1993   Matsumoto et al. ..................... 372/45

FOREIGN PATENT DOCUMENTS 0 697 756   2/1996   European Pat. Off. .
0 701 309 A2   3/1996   European Pat. Off. .

OTHER PUBLICATIONS

Masanori Watanabe et al, "Fundamental–Transverse–Mode High–Power AlGaInP Laser Diode with Windows Grown on Facets", IEEE Journal of Selected Topics in Quantum Electronics, vol. 1, No. 2, Jun. 1, 1995, pp. 728–733.

*Primary Examiner*—Minh Loan Tran
*Attorney, Agent, or Firm*—Frishauf, Holtz, Goodman, Langer & Chick, P.C.

[57] ABSTRACT

In a semiconductor laser device comprising a semiconductor laser main body having an active layer formed between a pair of cladding layers, and a non-absorbing layer of InGaP formed on the facets of the semiconductor laser main body and having a band gap greater than the band gap of the active layer, a diffusion blocking layer of, for example, Si, SiN or Ge is formed on the surface of the non-absorbing layer, and a di-electric protective layer of, for example, $AlO_x$, $SiO_x$, $SiN_x$ or $MgO_x$ for regulating reflectance at the facets and protecting the non-absorbing layer is formed on the diffusion blocking layer.

14 Claims, 4 Drawing Sheets

SEMICONDUCTOR LASER DEVICE HAVING A COD-PREVENTING STRUCTURE

BACKGROUND OF THE INVENTION

1. Field of the Invention

The present invention relates to a semiconductor laser device for use as a light source for optical communication and so forth, and more specifically to a semiconductor laser device having such structure as capable of preventing COD (catastrophic optical damage) and improving operational reliability.

2. Description of the Prior Art

A semiconductor laser device for use as a light source for optical communication and so forth needs to have high operational reliability and to hardly exhibit change in characteristics for a long time. For example, a semiconductor laser device used in a repeater for an optical fiber submarine cable needs to keep operational reliability for over a million hours.

Types of failure (degradation in operational characteristics) of the semiconductor laser device are broadly classified into gradual degradation, which is analogous to fatigue failure and due to long-time operation, and rapid degradation, which is due to COD produced at facets under high-power operation. The gradual degradation in operational characteristics is mainly caused by such a phenomenon that crystal defects inherent in the semiconductor laser device gradually increase as DLD (dark line defects), which may lead to failure of the semiconductor laser device. Causes of the gradual degradation in operational characteristics, however, have been mostly removed with development in semiconductor manufacturing technology. On the other hand, causes of COD produced at the facets of are still in process of analysis. At present, it is considered that repetition of the following process causes COD: When crystal defects existing at the surface of the facets of the semiconductor laser device absorb an emitted laser beam, the temperature at the facets rises, so that a band gap at the facets is reduced; as a result, the crystal defects increase.

In order to prevent the COD in the semiconductor laser device, such structure has been conventionally proposed that a non-absorbing layer of, for example, InGaP having a band gap greater than the band gap of an active layer of the semiconductor laser device is formed on the facets of the semiconductor laser device.

As shown in FIG. 3, a conventional semiconductor laser device of the aforementioned sort comprises, as its main part, a semiconductor laser main body 5 of double hetero structure in which, for example, an active layer 4 of InGaAs sandwiched between a pair of cladding layers 2, 3 of n-AlGaAs and p-AlGaAs is grown on a substrate 1 of n-GaAs. Facets 6 and 7 of the semiconductor laser main body 5 are formed by cleaving, and a non-absorbing layer 8 of InGaP, which has a band gap greater than the band gap of the active layer 4 and is optically transparent to a laser beam, is formed on one of the facets 6, 7 (an exit side cavity end face 7). Further, a dielectric protective layer 9 of $AlO_x$, $SiO_x$, $SiN_x$ or $MgO_x$, which is for regulating reflectance at the facet 7 and protecting the non-absorbing layer 8, is formed on the non-absorbing layer 8. Reference numeral 10 indicates a reflecting film of laminate of $SiO_2$ and Si, having high reflectance and formed on the other facet 6. The thickness of the non-absorbing layer 8 is 80 nm or so, and the thickness of the dielectric protective layer 9 is 180 nm or so.

In the semiconductor laser device of the above described structure, since photo-absorption due to the crystal defects at the facet 7 can be restrained by the non-absorbing layer 8 of InGaP, COD can be prevented to a certain degree. However, there remains a problem that COD is still produced when the semiconductor laser device is made to operate with high power or operate continuously for a long time.

SUMMARY OF THE INVENTION

The object of the present invention is to provide a semiconductor laser device having such structure as capable of effectively restraining COD produced due to crystal defects at the facets of the semiconductor laser device, and thereby having an improved operational reliability.

The particular object of the present invention is to materialize a semiconductor laser device in which a non-absorbing layer of, for example, InGaP and having a band gap greater than the band gap of an active layer of a semiconductor laser main body is formed on the facets of the semiconductor laser main body, with the structure capable of preventing degradation in characteristics of the non-absorbing layer.

Analyzing the process of occurrence of COD at the facets of the semiconductor laser device with a variety of analytical methods, the inventors of the present invention have found that P(phosphorus) contained in the non-absorbing layer of InGaP formed on the facets is diffused into the protective layer of $AlO_x$ or so forth formed on the non-absorbing layer for protecting same, which is one of causes of COD.

FIG. 4 shows an atomic component profile obtained by Auger electron spectroscopy in the depth direction of the vicinity of the facets of a semiconductor laser device, when the semiconductor laser device is degraded in characteristics due to occurrence of COD. The distribution of Al, P and As shown in the profile indicates that P contained in the non-absorbing layer is diffused into the dielectric protective layer having Al as a primary component.

Though the mechanism of how the diffusion of P causes COD is not yet clear, it can be considered as follows:

i) P diffused into the dielectric protective layer combines with oxygen contained in the dielectric protective layer and forms a oxide glass $PO_x$. $PO_x$ is optically opaque to an emitted laser beam, and therefore absorbs the laser beam. As a result, the temperature at the facets rises.

ii) Due to the diffusion of P into the dielectric protective layer, the ratio of P in the non-absorbing layer of InGaP becomes small. As a result, the transparency of the non-absorbing layer to the laser beam is lowered, and photo-absorptance thereof is increased, so that the temperature at the facets rises.

iii) Due to the diffusion of P into the dielectric protective layer, vacancies in the non-absorbing layer of InGaP form an energy level in the band gap of the semiconductor laser main body. The laser beam is absorbed due to that energy level formed by the vacancies, so that the temperature at the facets rises.

Based on the above described consideration, the inventors have carried out a variety of experiments and their evaluation, with a view to preventing the diffusion of P from the non-absorbing layer of InGaP into the dielectric protective layer of, for example, $AlO_x$, and found that if the dielectric protective layer is formed having a diffusion blocking layer of, for example, Si, SiN or Ge interposed, the rate of occurrence of COD at the facets can be remarkably reduced.

Thus, the object of the present invention is to materialize a semiconductor laser device of such structure that a diffusion blocking layer of Si, SiN or Ge is formed on a non-absorbing layer of InGaP which is formed on the facets of a semiconductor laser main body, and a dielectric protective layer of $Al_x$, $SiO_x$, $SiN_x$ or $MgO_x$ is formed having that diffusion blocking layer interposed, thereby to provide a semiconductor laser device capable of restraining COD and having high operational reliability.

DETAILED DESCRIPTION OF THE INVENTION

Figure 1:
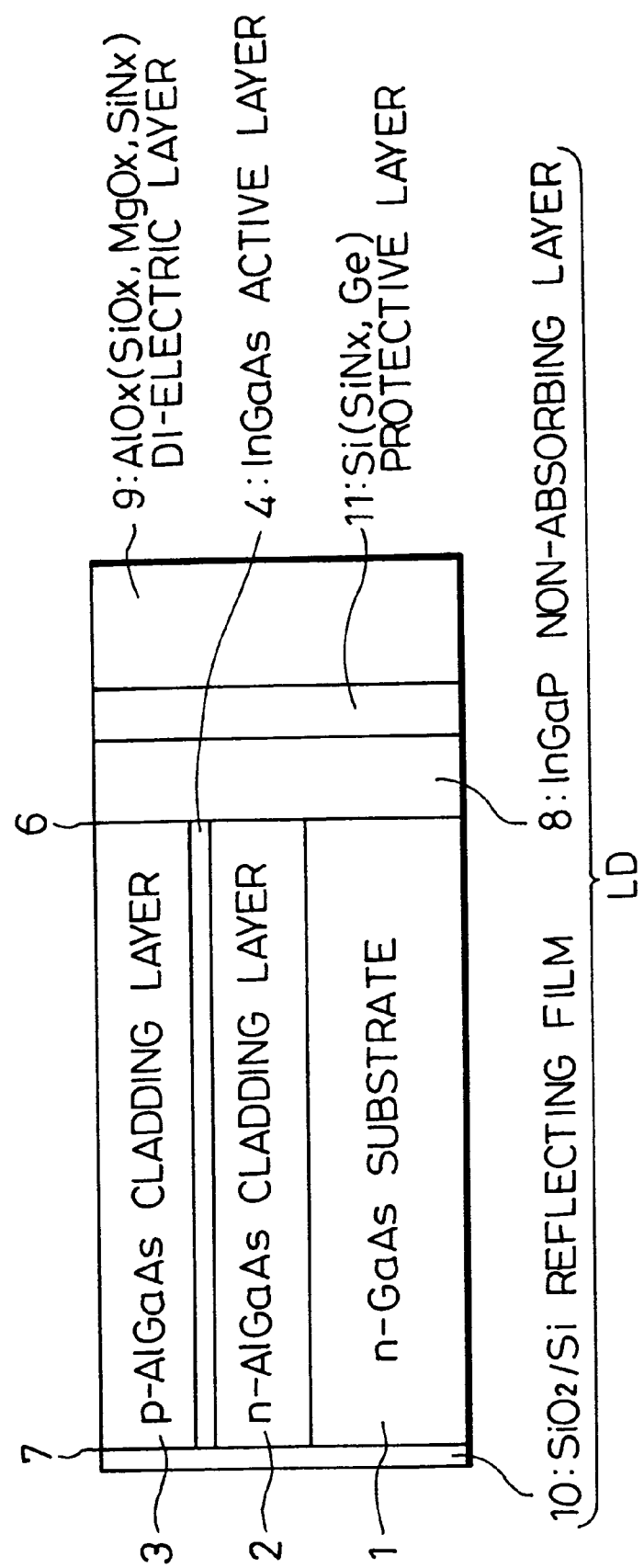
FIG. 1 is a schematic diagram showing the structure of a semiconductor laser device according to an embodiment of the present invention.

A semiconductor laser device according to an embodiment of the present invention has a structure as shown in FIG. 1. The semiconductor laser device comprises, as its main part, a semiconductor laser main body 5 of double hetero structure in which, for example, an active layer 4 of InGaAs sandwiched between a pair of cladding layers 2, 3 of n-AlGaAs and p-AlGaAs is grown on a substrate 1 of n-GaAs. In respect of the semiconductor laser main body 5, the semiconductor laser device according to the present invention is similar to conventional semiconductor laser devices, having no particular features.

A non-absorbing layer 8 of InGaP, which has a band gap greater than the band gap of the active layer 4 and is optically transparent to a laser beam, is formed on one of the facets 6, 7 (an exit side the facet 7), formed by cleaving, of the semiconductor laser main body 5. The thickness of the non-absorbing layer 8 is, for example, 80 nm or so. On the surface of the non-absorbing layer 8 is formed a diffusion blocking layer 11 of, for example, Si, SiN or Ge, and with the interposition of that diffusion blocking layer 11, a dielectric protective layer 9 of, for example, $AlO_x$, $SiO_x$, $SiN_x$ or $MgO_x$ is formed having a thickness of 180 nm or so. The semiconductor laser device is materialized in this manner.

The diffusion blocking layer 11 of Si, SiN or Ge needs to have a thickness larger than 2 nm in order to be able to prevent the diffusion of P effectively. On the other hand, even if the diffusion blocking layer 11 is formed having a thickness larger than 30 nm, a further improved diffusion blocking effect can not be expected. Moreover, when the diffusion blocking layer 11 is formed having a thickness larger than 30 nm, it is feared that the diffusion blocking layer 11 exhibits laser beam absorption, so that laser oscillation efficiency is lowered. For those reasons, it is desirable that the diffusion blocking layer 11 of Si, SiN or Ge has a thickness of 2~30 nm.

The formation of the non-absorbing layer 8 of InGaP onto the facet 7 of the semiconductor laser main body 5 is carried out using a known crystal growth technique such as the MOCVD (metal organic chemical vapor deposition). In that case, if the semiconductor laser main body 5 is an InGaAs/ GaAs semiconductor as described above, it is desirable, in view of matching of lattice constant, that the ratio of In (indium) in the non-absorbing layer 8 of InGaP is 0.5 or so. The preferred thickness of the non-absorbing layer 8 is about 10~200 nm.

The diffusion blocking layer 11 and the dielectric protective layer 9 can be formed by growth using the PCVD (plasma-assisted chemical vapor deposition) or so forth. It goes without saying that a reflecting film 10 of laminate of $SiO_2$ and Si having high reflectance is formed on the other facet 6 of the semiconductor laser main body 5.

The table shown below exhibits the result of evaluation of COD in respective semiconductor laser devices which were materialized using Si, SiN or Ge for the diffusion blocking layer 11 and $Al_x$, $SiO_x$, $SiN_x$ or $MgO_x$ for the dielectric protective layer 9 in the above described structure. The evaluation was carried out as follows: 50 samples of each semiconductor laser device having material composition specified for each Example were made to operate ensuring a laser oscillation output of 250 mW, on the temperature condition of 60° C. continuously for 1000 hours; and the number of samples which stopped laser oscillation due to occurrence of COD during those testing hours was counted for each Example. As a Comparative Example, a semiconductor laser device of the conventional structure having no diffusion blocking layer 11, that is, having a dielectric protective layer 9 of $AlO_x$ formed directly on a non-absorbing layer 8 of InGaP was tested in the same manner. In each semiconductor laser device, the thickness of the dielectric protective layer 9 is 180 nm, and the thickness of the diffusion blocking layer 11 is 20 nm.

TABLE

|  | Diffusion blocking layer 10 | Dielectric protective layer 8 | Number of samples in which COD occurred |
|---|---|---|---|
| Example 1 | Si | $Al_2O_3$ | 1 |
| Example 2 | Si | $SiO_2$ | 0 |
| Example 3 | Si | MgO | 0 |
| Example 4 | Si | $Si_3N_4$ | 1 |
| Example 5 | Ge | $SiO_2$ | 1 |
| Example 6 | $Si_3N_4$ | $SiO_2$ | 1 |
| Comparative Example | None | $Al_2O_3$ | 15 |

Comparison between the numbers of samples in which COD occurred shows that COD can be restrained effectively by forming the dielectric protective layer 8 with the interposition of the diffusion blocking layer 11 of Si, SiN or Ge.

Figure 2:
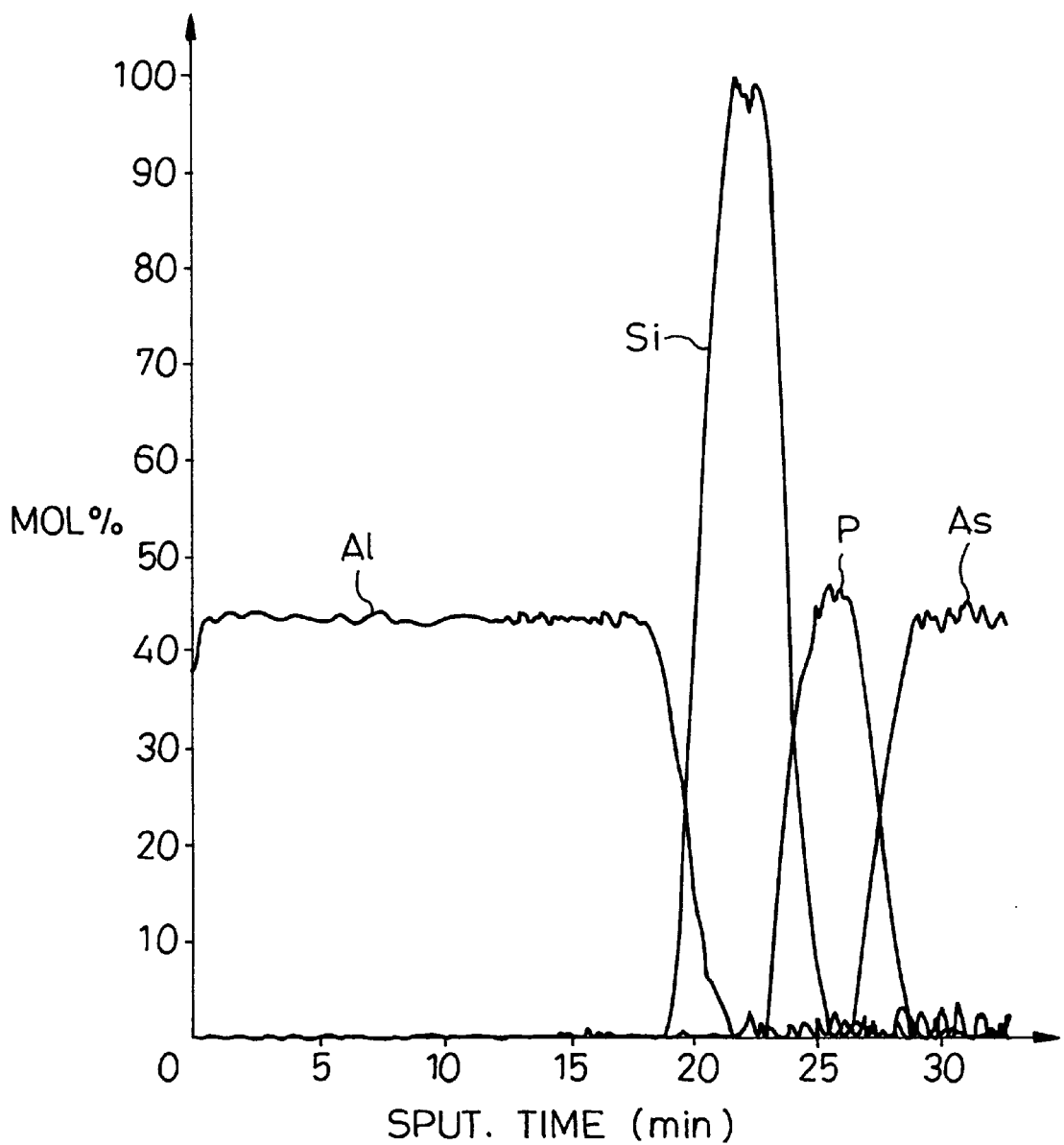
FIG. 2 shows an atomic component profile obtained by Auger electron spectroscopy in the depth direction of a cavity end face of a semiconductor laser device according to an embodiment of the present invention.
Figure 3:
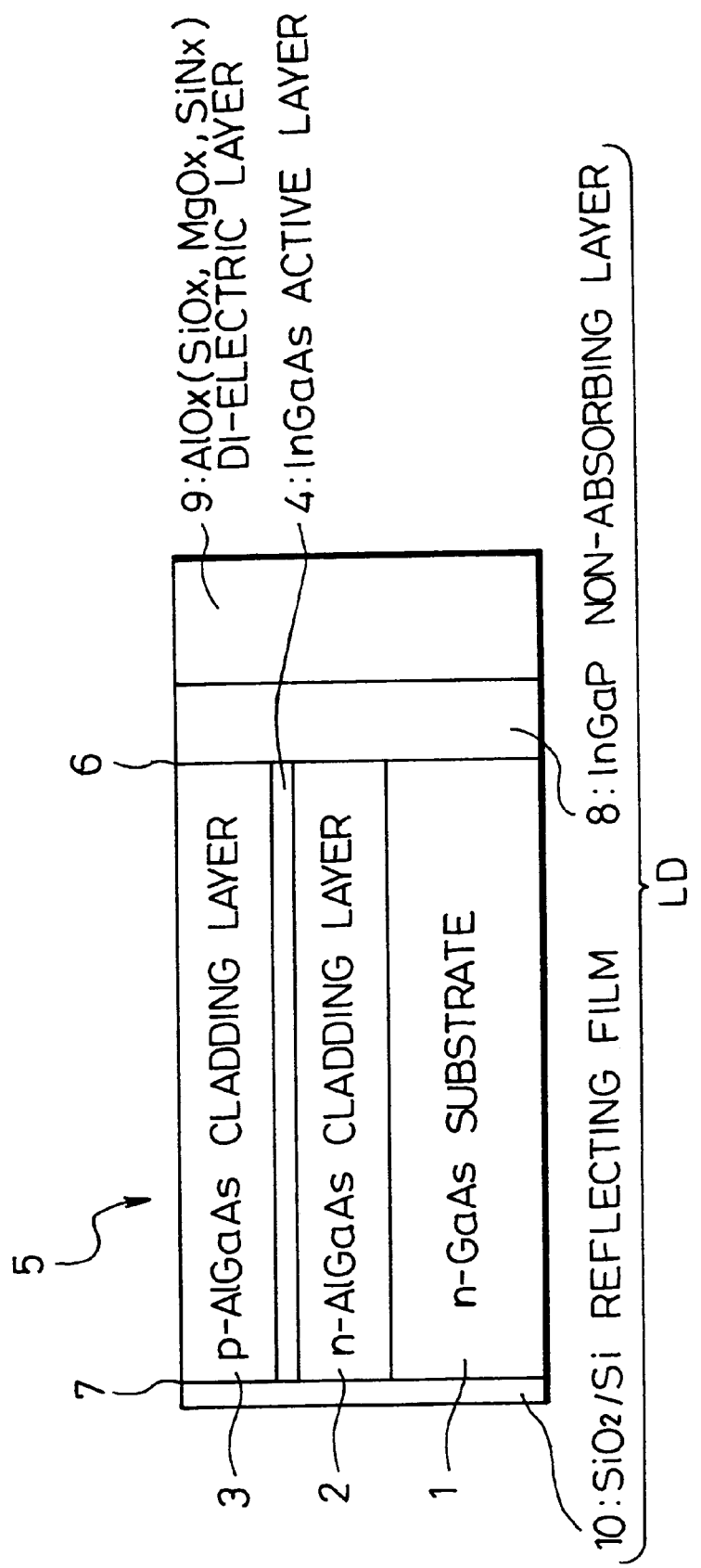
FIG. 3 is a schematic diagram showing the structure of a conventional semiconductor laser device.
Figure 4:
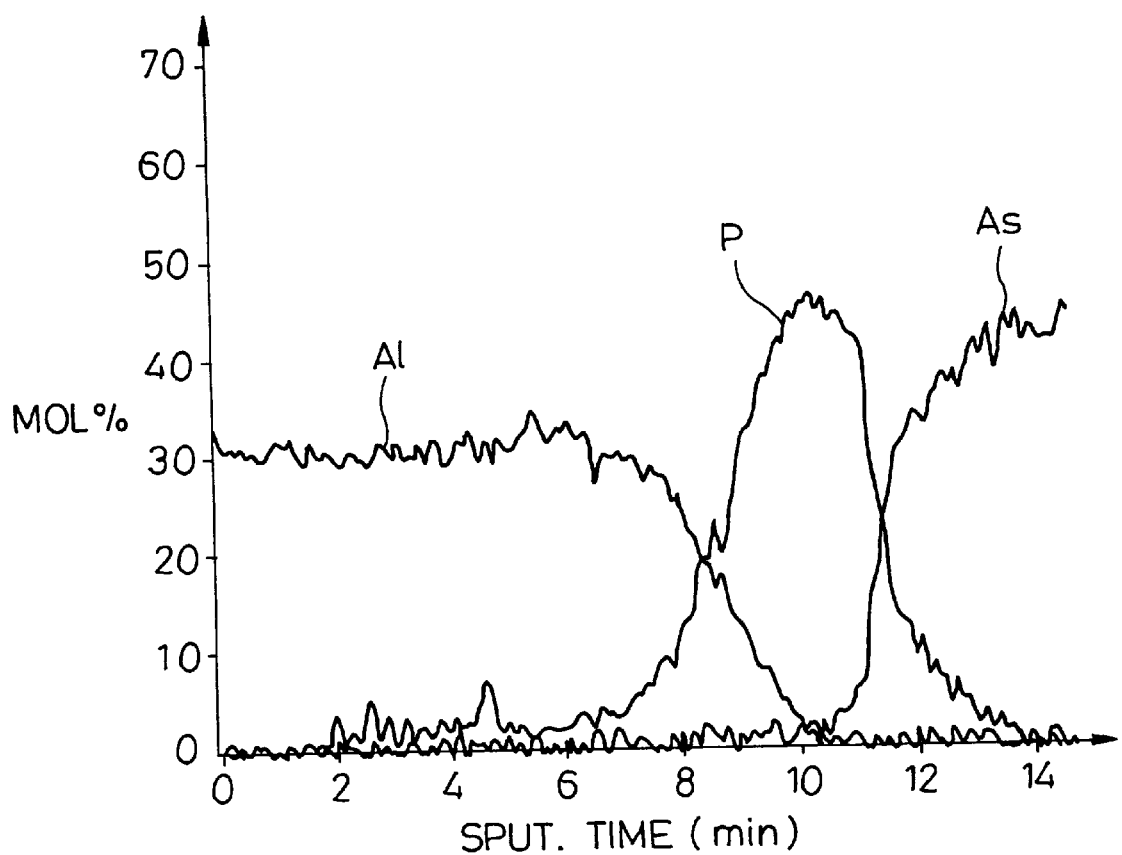
FIG. 4 shows an atomic component profile obtained by Auger electron spectroscopy in the depth direction of the facets of a conventional semiconductor laser device.

FIG. 2 shows atomic component profiles in the depth direction of the vicinity of the facets of the semiconductor laser device of Example 1, that is, the semiconductor laser device of such structure that the diffusion blocking layer 11 of Si is formed on the non-absorbing layer 8 of InGaP which is formed on the facets of the semiconductor laser main body 5, and the dielectric protective layer 9 of $Al_2O_3$ is formed on that diffusion blocking layer 11. The atomic component profile shown in FIG. 2 was obtained by Auger electron spectroscopy, as is the case with the profiles in FIG. 4. The atomic component profiles in FIG. 2 shows that the diffusion of P from the non-absorbing layer 8 into the dielectric protective layer 9 is restrained effectively by Si of the diffusion blocking layer 11 interposed therebetween.

Thus, it is clear that by forming the dielectric protective layer 9 with the interposition of the diffusion blocking layer 11, the diffusion of P from the non-absorbing layer 8 into the dielectric protective layer 9 can be prevented, so that COD is restrained and the operational reliability of the semiconductor laser device is improved.

The present invention is not limited to the above described embodiments. The non-absorbing layer 8 of, for example, InGaP may be replaced by another non-absorbing layer as long as it has a band gap greater than the band gap of the active layer 4 of the semiconductor laser main body 5 and is transparent to a laser beam. The semiconductor laser main body 5 is not limited particularly to InGaAs/GaAs semiconductor. In short, the present invention is applicable to the case in which a non-absorbing layer of InGaP is formed, with a view to preventing COD, on the facets of a semiconductor laser main body according to a variety of conventionally proposed structures.

What is claimed is:

1. A semiconductor laser device comprising: a semiconductor laser main body having an active layer formed between a pair of cladding layers, a non-absorbing layer of InGaP formed on a facet of said semiconductor laser main body and having a band gap greater than the band gap of said active layer, a diffusion blocking layer formed on a surface of said non-absorbing layer, and a dielectric protective layer formed on said diffusion blocking layer, said diffusion blocking layer having a thickness of 2 to 30 nm.

2. A semiconductor laser device according to claim 1, wherein said dielectric protective layer is selected from the group consisting of $AlO_x$, $SiO_x$, $SiNx$ and $MgO_x$ to regulate reflectance at said facet and protect said non-absorbing layer, and said diffusion blocking layer is one selected from the group consisting of Si, SiN and Ge to block diffusion of P from said non-absorbing layer into said dielectric protective layer.

3. A semiconductor laser device according to claim 2, wherein said diffusion blocking layer is made of Si, and said di-electric protective layer is made of $AlO_x$.

4. A semiconductor laser device according to claim 2, wherein the diffusion blocking layer comprises Si and the dielectric protective layer comprises $Al_2O_3$.

5. A semiconductor laser device according to claim 2, wherein the diffusion blocking layer comprises Si and the dielectric protective layer comprises $SiO_2$.

6. A semiconductor laser device according to claim 2, wherein the diffusion blocking layer comprises Si and the dielectric protective layer comprises MgO.

7. A semiconductor laser device according to claim 2, wherein the diffusion blocking layer comprises Si and the dielectric protective layer comprises $Si_3N_4$.

8. A semiconductor laser device according to claim 2, wherein the diffusion blocking layer comprises Ge and the dielectric protective layer comprises $SiO_2$.

9. A semiconductor laser device according to claim 2, wherein the diffusion blocking layer comprises $Si_3N_4$ and the dielectric protective layer comprises $SiO_2$.

10. A semiconductor laser device according to claim 2, wherein the non-absorbing layer has a thickness of 10 to 200 nm.

11. A semiconductor laser device according to claim 1, wherein the ratio of In in said non-absorbing layer of InGaP is about 0.5.

12. A semiconductor laser device according to claim 11, wherein said non-absorbing layer has a thickness of 10~200 nm.

13. A semiconductor laser device according to claim 1, wherein the cladding layers comprise a p-AlGaAs cladding layer and an n-AlGaAs cladding layer disposed on an n-GaAs substrate.

14. A semiconductor laser device according to claim 1, wherein the non-absorbing layer has a thickness of 10 to 200 nm.

* * * * *